(12) United States Patent
Miura et al.

(10) Patent No.: US 7,071,500 B2
(45) Date of Patent: Jul. 4, 2006

(54) SEMICONDUCTOR DEVICE AND MANUFACTURING METHOD FOR THE SAME

(75) Inventors: Makoto Miura, Kokubunji (JP); Katsuyoshi Washio, Tokorozawa (JP); Hiromi Shimamoto, Iruma (JP)

(73) Assignee: Renesas Technology Corp., Tokyo (JP)

( * ) Notice: Subject to any disclaimer, the term of this patent is extended or adjusted under 35 U.S.C. 154(b) by 116 days.

(21) Appl. No.: 10/866,673

(22) Filed: Jun. 15, 2004

(65) Prior Publication Data
US 2004/0262715 A1 Dec. 30, 2004

(30) Foreign Application Priority Data
Jun. 19, 2003 (JP) .............................. 2003-174228

(51) Int. Cl.
*H01L 31/072* (2006.01)
(52) U.S. Cl. ...................... 257/197; 257/552; 257/560; 257/564
(58) Field of Classification Search .................... None
See application file for complete search history.

(56) References Cited

U.S. PATENT DOCUMENTS 5,610,435 A * 3/1997 Watanabe et al. ........... 257/629

FOREIGN PATENT DOCUMENTS

| JP | 7-147287 | 11/1993 |
|---|---|---|
| JP | 11-233524 | 2/1998 |
| JP | 2000-77419 | 8/1998 |

* cited by examiner

*Primary Examiner*—Fetsum Abraham
(74) *Attorney, Agent, or Firm*—Reed Smith LLP; Stanley P. Fisher, Esq.; Juan Carlos A. Marquez, Esq.

(57) ABSTRACT

A bipolar semiconductor device including a collector layer covered at a portion of an outer periphery thereof with an insulating film and having a shape extending in an upper direction and a horizontal direction, with a gap being formed between the collector layer and the insulating film, and further including a base layer and an emitter layer disposed over the collector layer, and a manufacturing method of the semiconductor device. Since the collector layer has a shape extending in a portion thereof in the upward direction and the horizontal direction, an external collector region can be deleted, and both the parasitic capacitance and the collector capacitance in the intrinsic portion attributable to the collector can be decreased and, accordingly, a bipolar transistor capable of high speed operation at a reduced consumption power can be constituted.

5 Claims, 13 Drawing Sheets

⊕ : n-TYPE IMPURITY
⊖ : p-TYPE IMPURITY

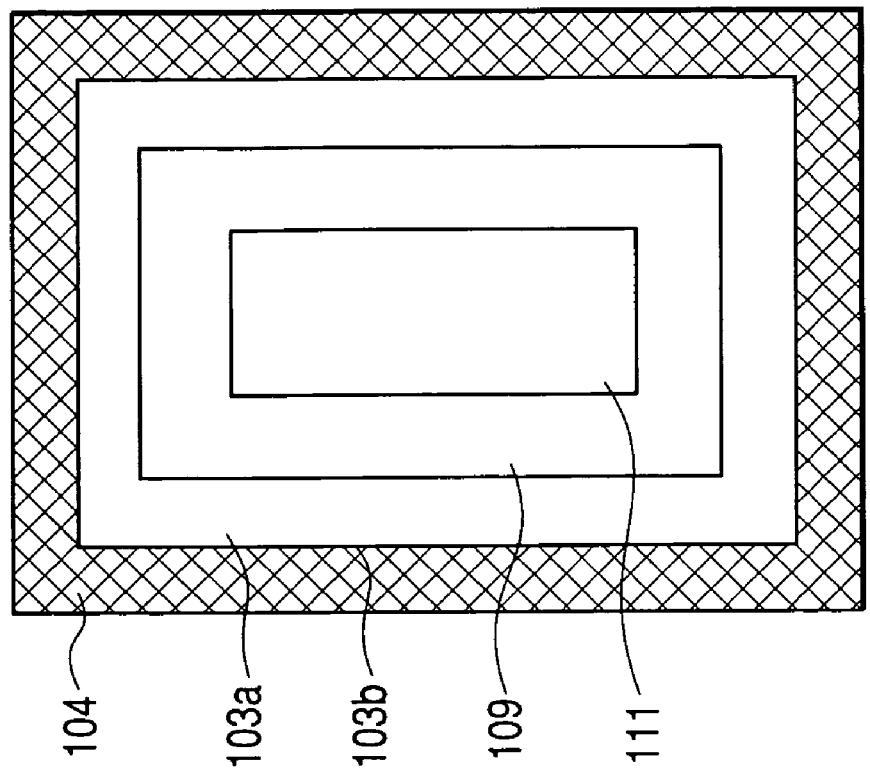
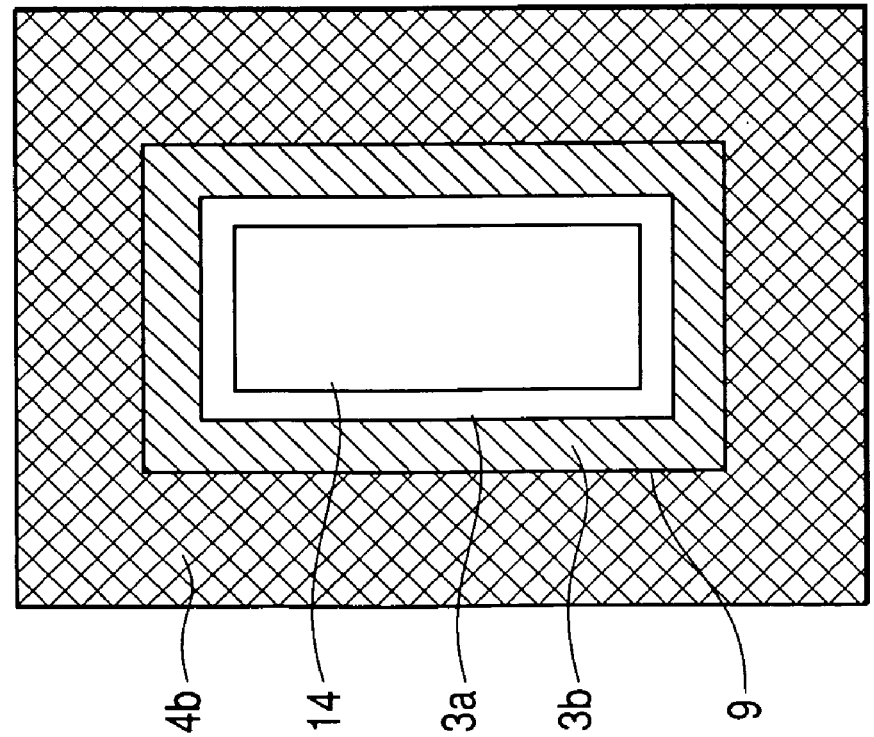

SEMICONDUCTOR DEVICE AND MANUFACTURING METHOD FOR THE SAME

CLAIM OF PRIORITY

The present application claims priority from Japanese Application JP 2003-174228 filed on Jun. 19, 2003, the content of which is hereby incorporated by reference as if set forth in the entirety herein.

FIELD OF THE INVENTION

The present invention relates to a semiconductor device and a manufacturing method thereof, and more particularly to a semiconductor device and method including at least one bipolar junction transistor.

BACKGROUND OF THE INVENTION

In recent years, bipolar transistors having high speed performance have been used in various fields of application, such as communication devices and storage systems. A bipolar transistor capable of increasing operation speed is the bipolar transistor using a selective epitaxial technology disclosed, for example, in JP-A No. 7-147287. FIG. 2 illustrates a p-type base layer 109 and an n-type type emitter region 111 formed in a patterned structure, wherein the width of the base layer 109 is determined by the emitter area 111. Since there is no requirement for considering alignment margin in the lithography disclosed, the collector-base junction area can be decreased in FIG. 2. However, in the bipolar transistor of this type, a parasitic capacitance derived from regions other than the collector-base junction is present.

In FIG. 2, a distance d1 is necessary between the base region 109 and the low concentration collector region 103b to account for misalignment in the lithographic steps, and the etching scattering that occurs upon forming an opening. Accordingly, a parasitic capacitance C1 is present between the base electrode 106 and the low concentration collector layer 103b, due to insulating film 105. The thickness of the collector-base isolation insulating film 105 is substantially equal to the base layer 109, and the base layer is reduced as the operation speed of the transistor is increased, thereby increasing the parasitic capacitance C1 as operation speed increases.

It is also necessary to provide a sufficient junction between the base layer 109 and the base electrode 106 to prevent an increase in the base resistance, and there is nonetheless a lower limit for the parasitic capacitance that is dependent on the external base-collector junction area. The parasitic capacitance increases as the transistor size is reduced, and becomes as large as 50% for the collector capacitance.

Thus, to increase the operation speed of a bipolar transistor, high cut off frequency, low base resistance and low collector capacitance are necessary. However, in existent bipolar transistors, the parasitic capacitance between the base and the collector inhibits high speed operation of the transistor. Further, while the reduction of transistor size and the decrease of the collector capacitance are essential to lower the consumption power of an operating transistor, the effect of the parasitic capacitance from the periphery of the transistor increases as the transistor size becomes smaller, thereby inhibiting the decrease in the consumption power.

Therefore, the need exists for a bipolar junction transistor having low consumption power, high speed, and low parasitic capacitance.

SUMMARY OF THE INVENTION

The present invention provides a semiconductor device and device manufacturing method capable of reducing an external collector area while maintaining a low base resistance. The semiconductor device and method also allow for a decrease in the parasitic capacitance between the collector and the base that typically inhibits increase of the operation speed, and a decrease of the consumption power in a bipolar transistor.

A semiconductor device according to the present invention may include a first conductor layer of a first conduction type disposed on a semiconductor substrate, covered by at least a portion of an outer circumference thereof with a first insulating film extending in an upward direction and in a horizontal direction starting from the region covered with the first insulating film, a second semiconductor layer of a second conduction type disposed over the first semiconductor layer, and a third semiconductor layer of the first conduction type disposed over the second semiconductor layer, wherein a cavity is provided by at least the first semiconductor layer and the first insulating film. The semiconductor device of the present invention may be a bipolar transistor using a first semiconductor layer as a collector, the second semiconductor layer as a base and the third semiconductor layer as an emitter. In an embodiment, the collector and the base of a semiconductor device may be of single crystal silicon-germanium or single crystal-germanium-carbon, and the emitter may be of single crystal silicon, single crystal silicon-germanium or single crystal-germanium-carbon.

An embodiment of the semiconductor device according to the present invention may have a first polycrystalline layer of a second conduction type disposed over the first insulating film and connected with the second semiconductive layer, a second polycrystalline layer of the first conduction type disposed over the third semiconductor layer, and a second insulating film disposed to separate the first polycrystalline layer and the second polycrystalline layer.

In an embodiment of the semiconductor device, a cross section of the first semiconductor layer at a portion surrounded with the first insulating film may form a polygonal shape in which paired sides are oriented in a <110> or <111> direction.

A manufacturing method of a semiconductor device according to the present invention may include the steps of forming a first portion of a first conduction type on a semiconductor substrate, covering a portion of the side wall of the first portion with a first insulating film, forming a second portion of the first semiconductor layer over the first portion by selective epitaxial growing, forming a second semiconductor layer of a second conduction type over the first semiconductor layer, and forming a third semiconductor layer of a first conduction type over the second semiconductor layer, wherein the second portion of the first semiconductor layer extends in an upward direction and in a horizontal direction at initial formation and forms a gap relative to the first insulating film.

A manufacturing method of a semiconductor device according to the present invention may include the steps of forming a first insulating film having plural openings on a semiconductor substrate, forming a first semiconductor layer of a first conduction type over the semiconductor substrate, forming a second semiconductor layer of a second conduction type over the first semiconductor layer, and forming a third semiconductor layer of a first conduction type over the second semiconductor layer, wherein the first semiconductor layer is in contact at least a portion thereof with the side wall for the openings of the first insulating film upon forming the first semiconductor layer, and wherein the first semiconductor layer extends in an upward direction and in a horizontal direction starting from the edge of the side wall, and forms a gap between the first semiconductor layer and the first insulating film.

A manufacturing method in accordance with the present invention may include the steps of forming a first polycrystalline film in connection with the second semiconductor layer on the first insulating film, forming a second polycrystalline layer of a first conduction type over the third semiconductor layer, and forming a second insulating film for separating the first polycrystalline layer and the second polycrystalline layer.

Therefore, the present invention provides a bipolar junction transistor having low consumption power, high speed, and low parasitic capacitance.

BRIEF DESCRIPTION OF THE DRAWINGS

The various features of the present invention will now be described in greater detail with reference to the drawings of aspects of the present invention, and various related elements thereof, wherein like reference numerals designate like elements, and wherein:

FIGS. 5A and 5B are comparative plan views showing an embodiment of the semiconductor device according to the invention;

DETAILED DESCRIPTION

It is to be understood that the figures and descriptions of the present invention have been simplified to illustrate elements that are relevant for a clear understanding of the present invention, while eliminating, for purposes of clarity, many other elements found in a typical semiconductor device and method. Those of ordinary skill in the art will recognize that other elements are desirable and/or required in order to implement the present invention. But because such elements are well known in the art, and because they do not facilitate a better understanding of the present invention, a discussion of such elements is not provided herein. The disclosure herein is directed to all such variations and modifications to the applications, networks, systems and methods disclosed herein and as will be known, or apparent, to those skilled in the art.

Figure 2:
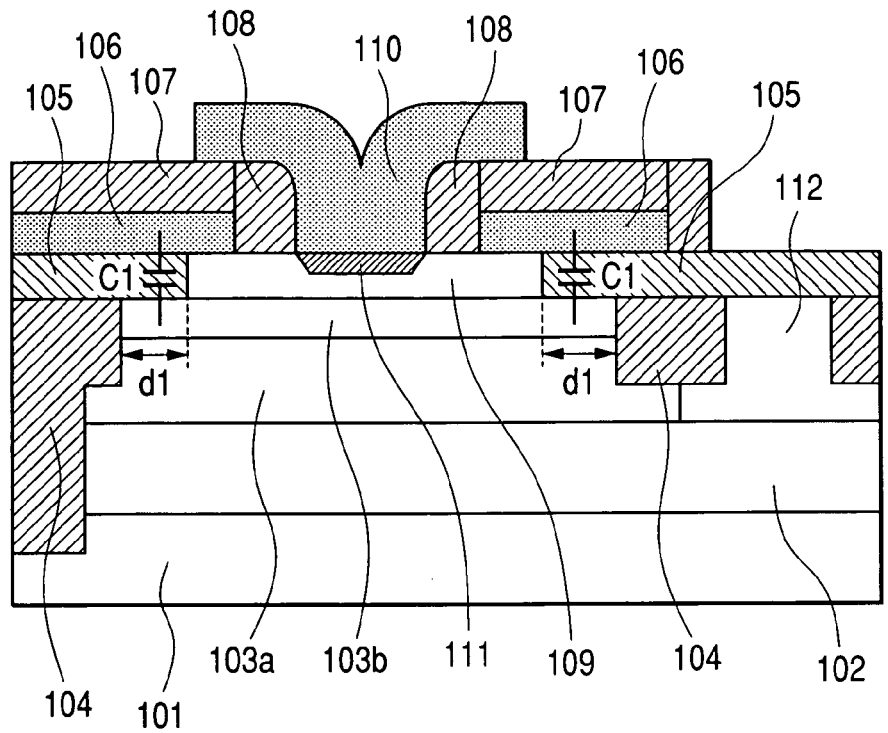
FIG. 2 is a cross sectional view showing a bipolar transistor.

In the present invention, a collector layer of single or plural layers may be disposed on a silicon substrate, the side wall for the portion of the collector layer may be covered with an insulating film, and the collector layer has a characteristic shape that extends in an upward direction and in a horizontal direction. The base layer and the emitter layer are disposed on the collector layer. Since the invention adopts a shape whereby the collector enters the inner side of the base, the parasitic capacitance caused by the collector external region (C1 in FIG. 2) is decreased, the depletion layer on the collector side of the collector-base junction increases, and the intrinsic portion collector capacitance decreases.

Figure 1:
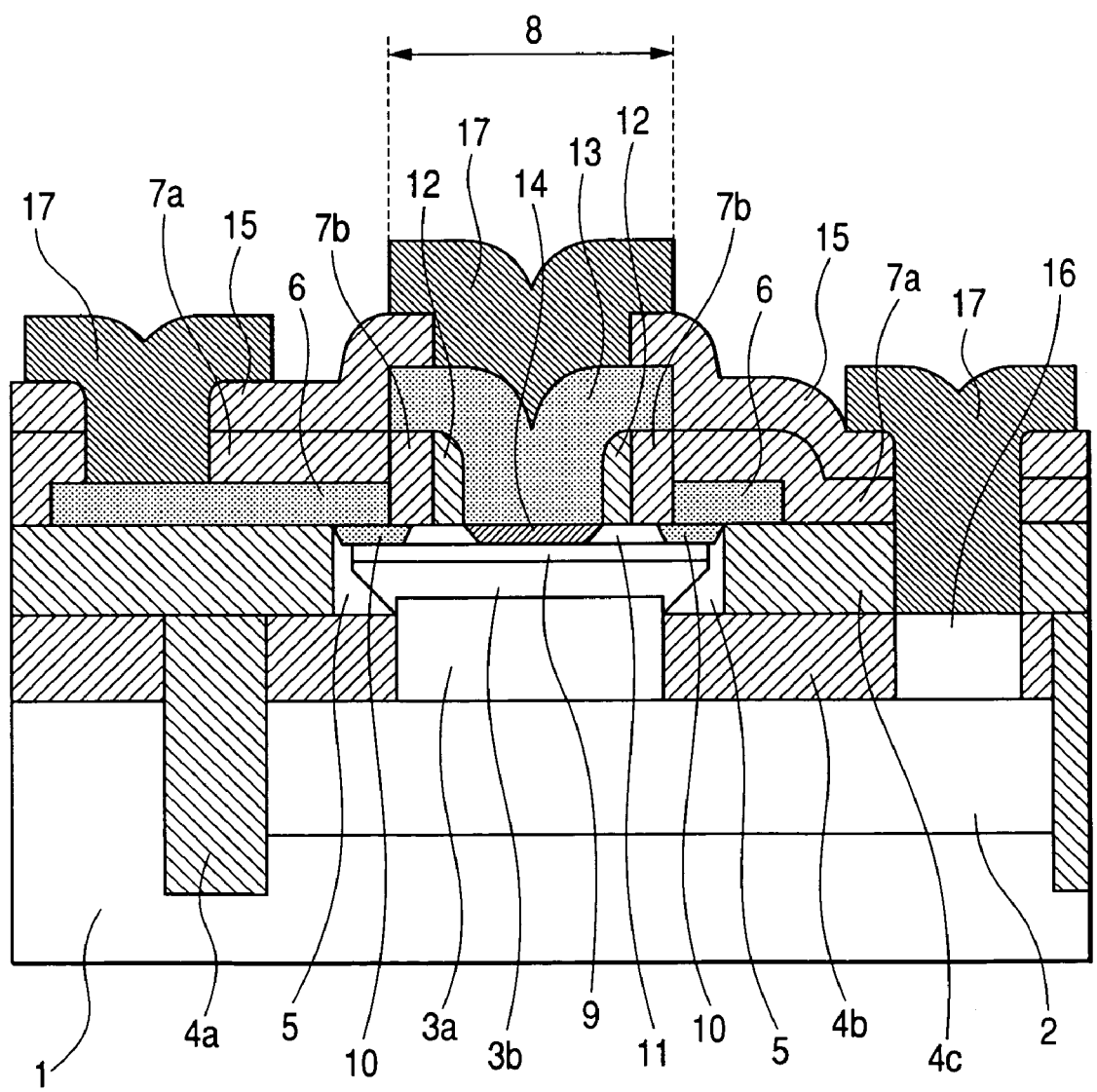
FIG. 1 is a cross sectional view showing an embodiment of a semiconductor device according to the invention.

FIG. 1 is a cross section showing an embodiment of a semiconductor device. FIG. 1 shows a first low concentration n-type collector layer 3a of single crystal silicon, and an insulating film 4b covering the outer periphery of the first collector layer 3a. The upper surface of insulating film 4b has a height lower than or equal with that of the upper surface of the first collector layer 3a at the boundary with the first collector layer 3a. A second collector layer 3b of low concentration n-type single crystal silicon-germanium is disposed selectively over the first collector layer 3a, and has a shape extending in an upward direction and in a horizontal direction. The shape extension starts from the boundary between the first collector layer 3a and the surface of the insulating film 4b. An insulating film 4c is disposed over the insulating film 4b, has an opening containing the first collector layer 3a, and separates the collector and the base. A cavity 5 is thus formed between the first collector layer 3a and the insulating films 4b and 4c.

Figure 3A:
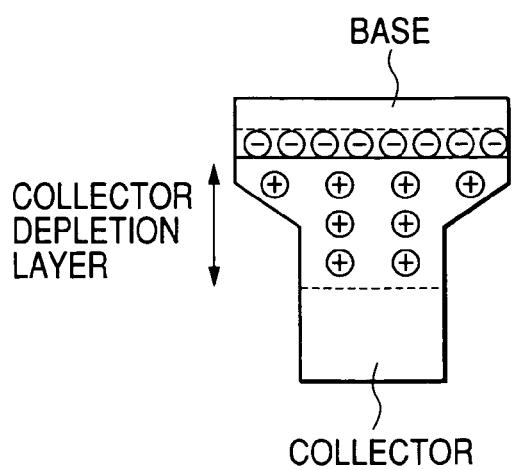
FIGS. 3A and 3B are comparative views of a collector depletion layer width at collector-base junction.
Figure 3B:
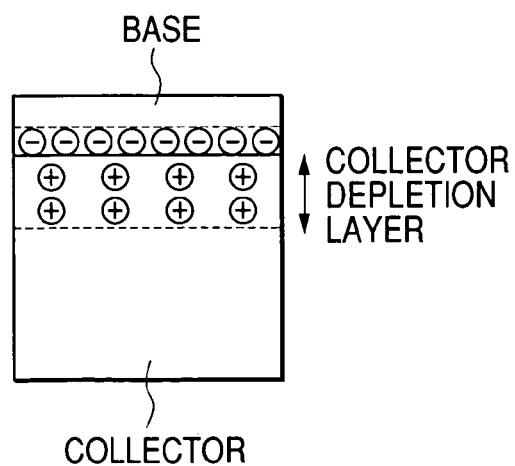

In this embodiment, since the first collector layer 3a is present in the second collector layer 3b, parasitic capacitance (C1 in FIG. 2) attributable to the first collector 3a can be decreased. Further, as shown in FIG. 3A, since the collector cross sectional area decreases from the collector-base junction, the depletion layer on the side of the collector in the collector-base junction increases as compared with the known art (FIG. 3B), and the collector capacitance in the intrinsic portion is also decreased. Accordingly, a bipolar transistor capable of increased operation speed and decreased consumption power is attained. Further, the shape of the second collector layer 3b induces the stress in the direction of extending the surface in the plain of the second collector layer 3b, which can decrease the strain near the surface of the second collector layer 3b lattice matched on silicon in a case of using silicon germanium for the second collector layer 3b as in this embodiment. Therefore, it is possible to increase the germanium composition in the collector layer 3b and the base layer 9 compared with the existent embodiment and electron band discontinuous quantity at the emitter-base junction can be increased and a bipolar transistor of higher performance can be attained. The effect is identical also in the subsequent embodiments.

In order to manufacture a semiconductor device in accordance with the present invention, n-type impurities of arsenic or antimony may be formed by ion implantation to at least a partial region of a silicon substrate 1, and then a high concentration n-type collector buried layer 2 may be formed by thermal diffusion. Then, a first collector layer 3a of a low concentration n-type single crystal may be deposited by epitaxial growing.

Figure 4A:
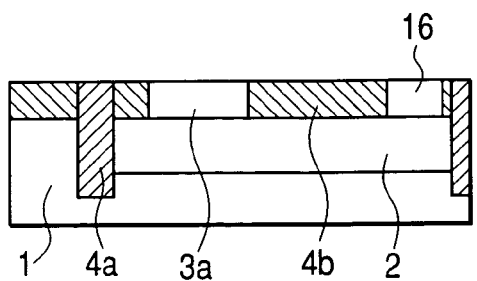
FIGS. 4A, 4B, 4C, 4D, 4E, 4F, and 4G are cross sectional views showing a method of manufacturing a semiconductor device according to the invention.

Insulating films 4a and 4b may be formed selectively, excluding a transistor forming region and a collector extension electrode region in order to isolate devices and obtain the structure shown in FIG. 4A. The device isolation structure may be formed by forming a low concentration n-type silicon layer over the silicon substrate 1 by an epitaxial growing process, and selectively oxidizing the low concentration n-type silicon layer while leaving a first collector region 3a, and a collector extension electrode region 17. Or, the device isolation structure may be formed by forming a low concentration n-type silicon layer, then scraping a device isolation region by lithographic technique, burying insulating films 4a and 4b, and then planarizing the surface, for example, by chemical mechanical polishing (CMP). Also, the isolation structure may be formed by depositing insulating films 4a and 4b on the silicon substrate, forming an opening, and then selectively forming a first collector region 3a and a collector extension electrode region 17 in the opening selectively by epitaxial growing or the like. The surface of the first collector region may have a square or rectangular shape, and paired sides may be oriented in the <110> or <100> direction.

An insulating film 4c may be deposited over the insulating film 4b. If the insulating film 4b and the insulating film 4c are different materials, an etching may be performed before the deposition of the insulating film 4c so as to lower the surface of insulating film 4b below the first collector layer 3a. A base extension electrode 6 of high concentration p-type polycrystalline silicon or high concentration p-type polycrystalline silicon-germanium, and an insulating film 7a, may be formed over the insulating film 4c, as shown in FIG. 4B. The p-type impurity for the base extension electrode 6 may be injected by ion implantation or may be added upon deposition, for example. An opening 8 may be formed to a multi-layered film including the base electrode 6 and the insulating film 7a, such as by lithographic technique and dry etching, and an insulating film may be further deposited and dry etched to form an emitter-base separating insulating film 7b in the opening 8 (FIG. 4C). The insulating film 4c may be etched selectively to open a portion below the base electrode 6 to provide collector and base forming regions. In this step, in a case where the insulating film 4b and the insulating film 4c are different materials, a silicon oxide film may be used for the insulating film 4b and the insulating films 7a and 7b, and a silicon nitride film may be used for the insulating film 4c. In this case, when phosphoric acid at 80° C. is used, the insulating film 4c may be etched selectively to the insulating film 4b and the insulating films 7a and 7b, to obtain a structure shown in FIG. 4D.

In a case where the insulating film 4b and the insulating film 4c are made of substantially the same material, a silicon oxide film may be used for the insulating films 4b and 4c, and a silicon nitride film may be used for the insulating films 7a and 7b, for example. In this case, the insulating films 4c and 4b may be isotropically etched by an aqueous hydrofluoric acid solution to obtain the structure shown in FIG. 4D. Then, a second low concentration n-type collector layer 3b of single crystal silicon-germanium may be formed by 30 to 40 nm over the first collector layer 3a, such as by selective epitaxial growing.

Figure 4E:
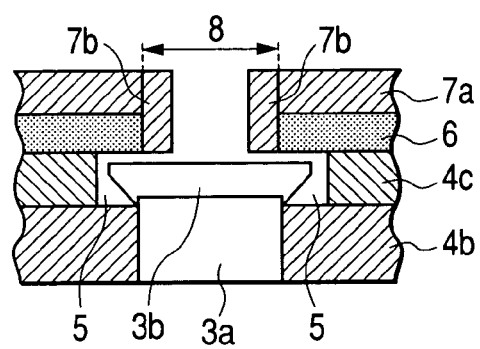
Figure 4B:
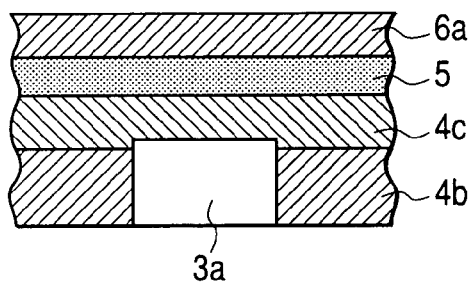
Figure 4F:
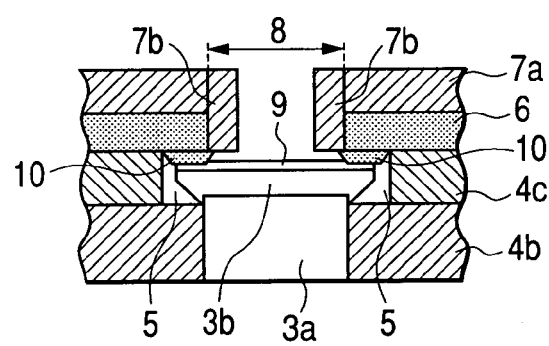
Figure 4C:
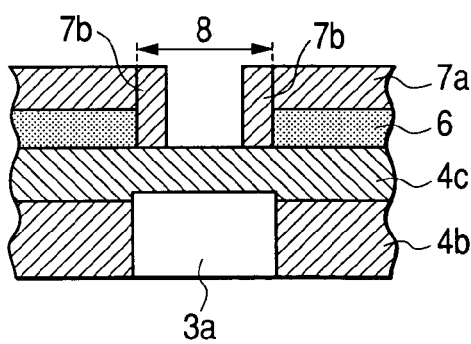

In this step, the second collector layer 3b may grow while extending in the horizontal direction to form a gap 5 relative to the insulating film 4b and the insulating film 4c (FIG. 4E). A p-type base layer 9 of single crystal silicon-germanium may be formed of 1 to 10 nm by selective epitaxial growing over the second collector layer 3b. In this step, a p-type external base layer 10 of polycrystalline silicon-germanium may be formed simultaneously with the base layer 9 below the base extension electrode 6, to connect the base extension electrode 6 and the base layer 9 (FIG. 4F). In this case, a growing of polycrystalline silicon-germanium to the portion below the base electrode 6, not during growing of the second collector region 3b but after the growing of the base layer 9, may be employed. This utilizes the difference between the growing start time of single crystal silicon (silicon-germanium) over the single crystal silicon (silicon-germanium), and the growing start time of polycrystalline silicon (silicon-germanium) over the polycrystalline silicon (silicon-germanium), which is inherent to the gas source molecular beam epitaxy (MBE) or chemical vapor deposition (CVD). Controllability in this process is favorable, particularly in the CVD process, and the growing conditions may include a pressure of 100 Pa or lower and a temperature from 500 to 700° C.

Figure 4G:
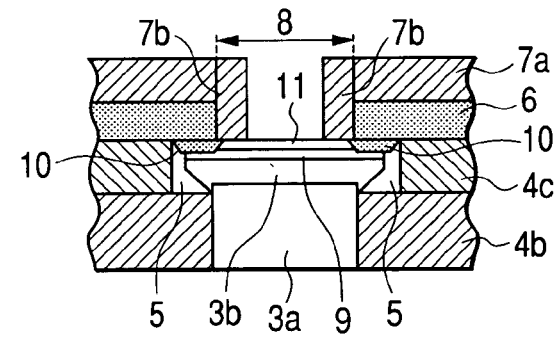
Figure 4D:
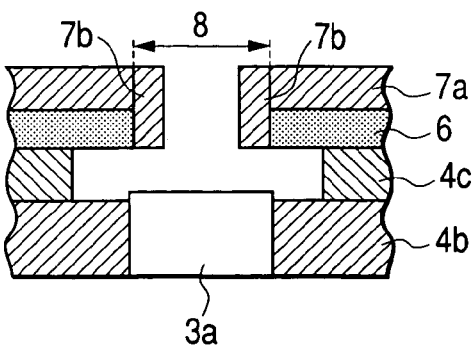

Then, a low concentration polycrystalline silicon layer 11 may be deposited by 5 to 20 nm on the base layer 9, such as by selective epitaxial growing (FIG. 4G). After depositing an insulating film, an emitter-base separation insulating film 12 may be formed by dry etching, and the opening may be buried with an emitter electrode 13 of high concentration n-type polycrystalline silicon. By applying a heat treatment to diffuse n-type impurities from the emitter electrode, an emitter region 14 may be formed in the single crystal silicon layer 11. The base extension electrode 6 and the emitter electrode 13 may be patterned, an oxide film 15 may be deposited over the entire surface, and an opening may be formed to each of the base extension electrodes 6, the emitter electrode 13, and the collector extension electrode 16. The electrode 17 may then be formed to obtain a cross sectional structure shown in FIG. 1.

FIG. 5A is a plan view showing a first collector region 3a, a second collector region 3b, a base region 9 and an emitter region 14. As illustrated by the comparison with the known art (FIG. 5B), the first collector region 3a is present inside the base region 9, and there is an area reduction for the first collector region and a size reduction for the entire transistor attained by the present invention (as shown in FIG. 5B, first and second collector regions 103a, 103b and base region 109, respectively). Further, when the first collector region is reduced, the area of the second collector region 3b is substantially equal with that of the base region 9, and the connection between the base layer 9 and the base extension electrode 6 can overcome misalignment upon forming the opening 8. Accordingly, the external collector region can be reduced without increasing the base resistance. To decrease the extension of the base width in the base layer 9 caused by the re-distribution of impurities from the heat treatment upon emitter formation, carbon may be added to a portion of the second collector layer 3b, the base layer 9 and the cap layer 11.

Figure 6:
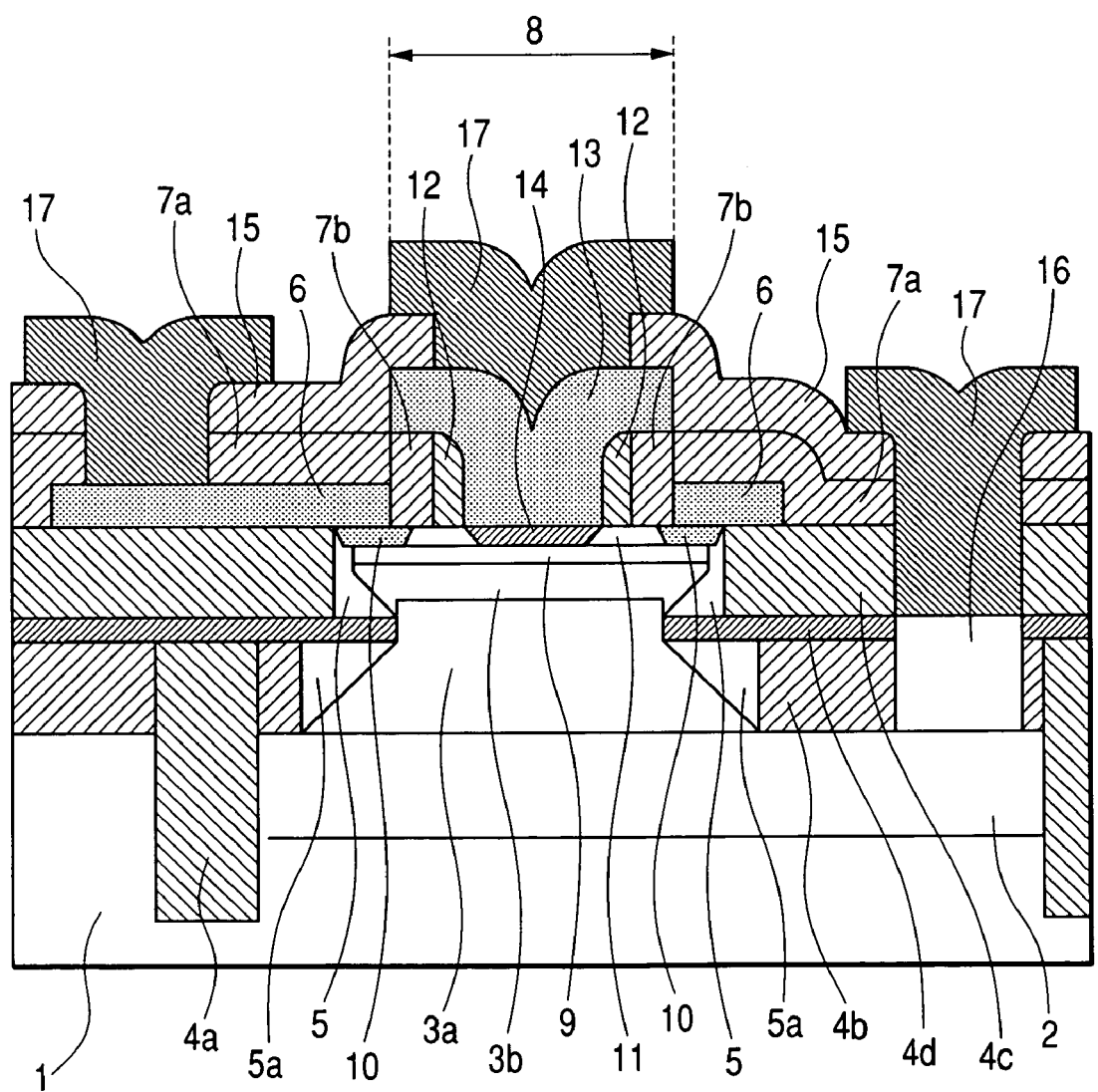
FIG. 6 is a cross sectional view showing an embodiment of a semiconductor device according to the invention.

FIG. 6 is a cross section showing an embodiment of a semiconductor device. In the semiconductor structure shown, an insulating film 4d is disposed between an insulating film 4b and an insulating film 4c, and the insulating film 4b forms an overhang over the insulating film 4d. A first low concentration collector 3a is within an opening formed of the insulating film 4b, and has a decreased area adjacent to the substrate, and protrudes from the insulating film 4d. A cavity 5a is present between the first collector 3a and the insulating films 4b and 4d. The cavity may be filled with air, a vacuum, an insulator, or a dielectric, for example, as may be apparent to those skilled in the art in light of the disclosure herein.

Since the cavity 5a is present at the periphery of the first collector layer, the insulating film in contact with the first collector layer can be removed substantially. Therefore, there is a further decrease in the capacitance between the base extension electrode 6 and the first collector layer 3a over embodiments discussed hereinabove.

Figure 7A:
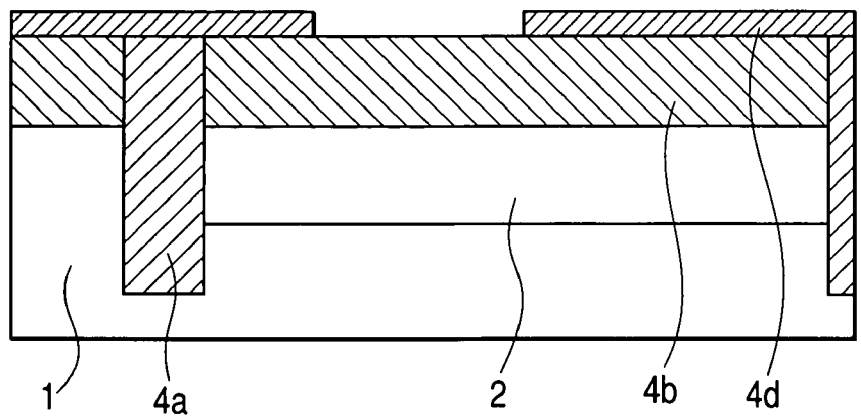
FIGS. 7A, 7B, and 7C are cross sectional views showing a method of manufacturing an embodiment of a semiconductor device according to the invention.

After depositing an insulating film 4b by way of a high concentration n-type buried layer 2 over a silicon substrate 1, and forming a device isolation insulating film 4a over a silicon substrate 1, an insulating film 4d may be deposited over the entire surface, and the insulating film 4d may be patterned by lithography and dry etching, as shown in FIG. 7A.

Figure 7B:
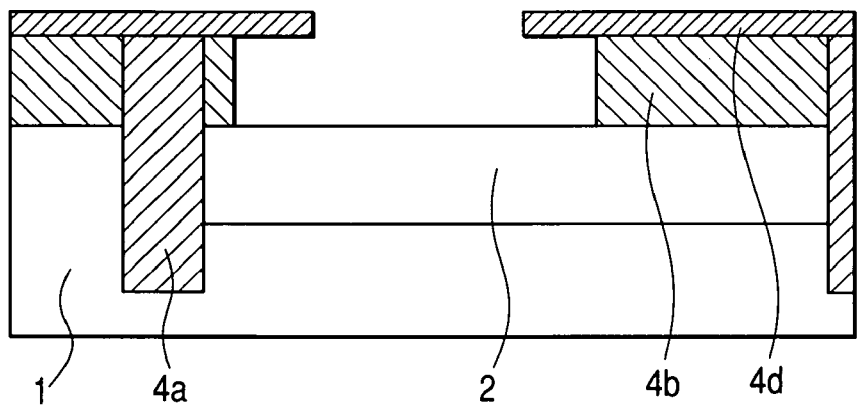
Figure 7C:
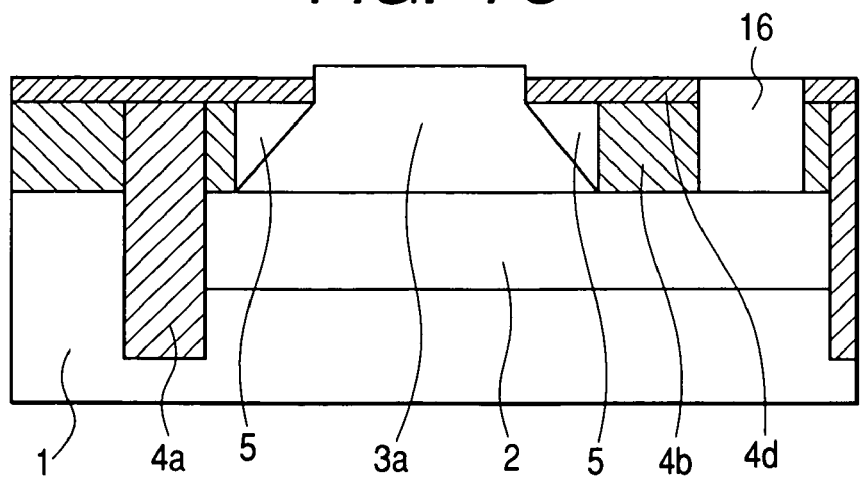

Then, only the insulating film 4b may be etched selectively to obtain the structure of FIG. 7B. In this step, when a silicon nitride film is used for the insulating film 4b and a silicon oxide film is used for the insulating film 4d, selective etching is possible for the insulating film 4b using phosphoric acid at 80° C. A low concentration n-type collector layer 3a comprising single crystal silicon may be formed in the opening by selective epitaxial growing such that the surface is higher than or equal with that of the insulating film 4d, to obtain a structure of FIG. 7C. Upon epitaxial growing, a collector extension layer 16 may also be formed by forming an opening to the insulating films 4b and 4d, selectively growing a low concentration n-type silicon to the collector extension region simultaneously with the growing of the collector layer 3a, and then injecting n-type impurities by ion implantation.

Figure 8:
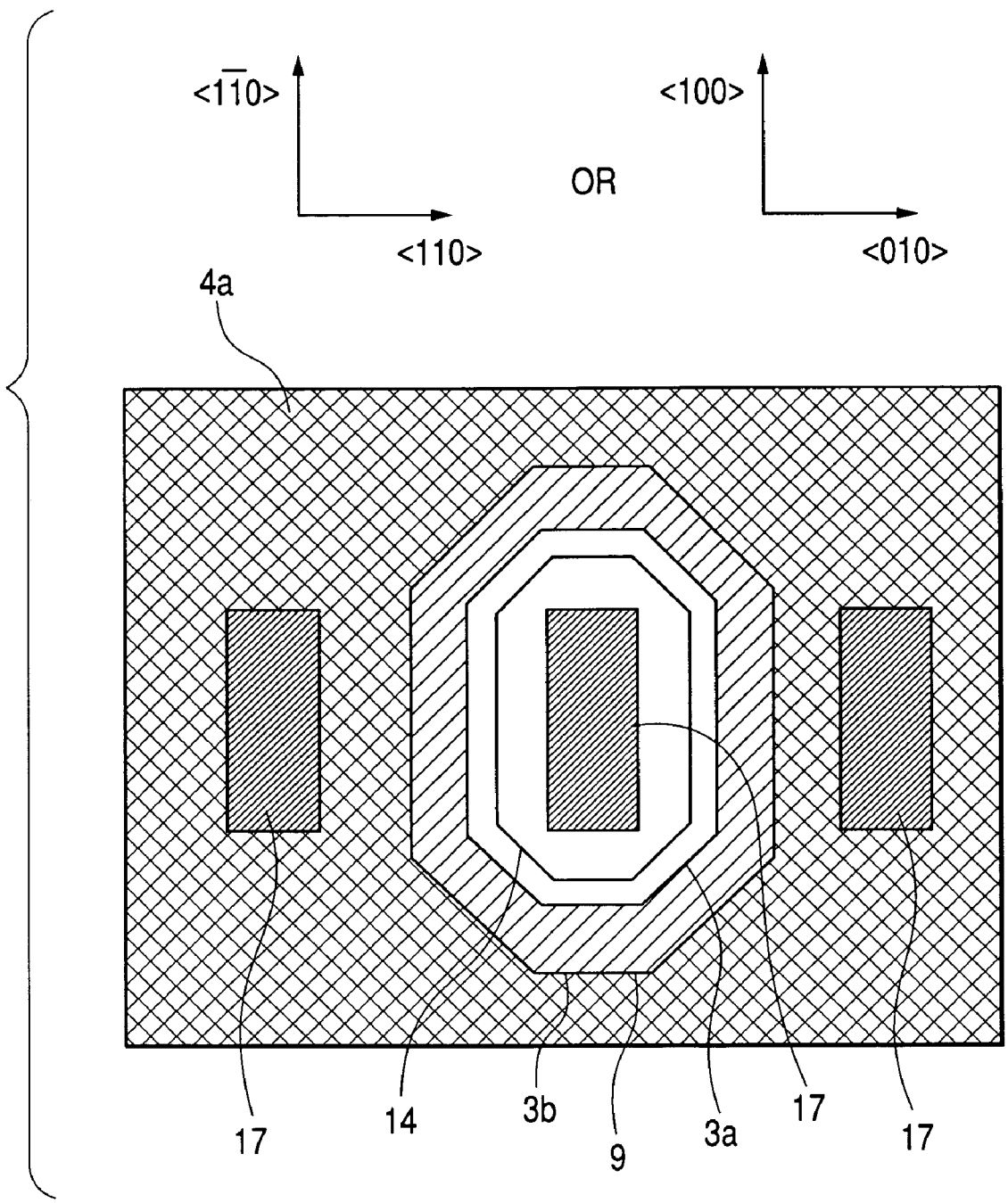
FIG. 8 is a cross sectional view showing an embodiment of a semiconductor device according to the invention.

FIG. 8 is a planar structural view showing an embodiment of a semiconductor device. FIG. 8 shows a first low concentration n-type collector layer 3a, a second low concentration n-type collector layer 3b, a base layer 9, an emitter layer 14 and electrodes 17. The emitter has an octagonal shape in which a first paired sides are oriented in the <110> direction and, the other paired sides are oriented in the <100> direction. If corners in the square or rectangular shape are scraped in this embodiment, current concentration at the corners may be modified. Accordingly, a bipolar transistor with high voltage withstand, and that exhibits an increase in operation speed and decrease in consumption power, due to a decrease in the collector capacitance, is provided.

Figure 9:
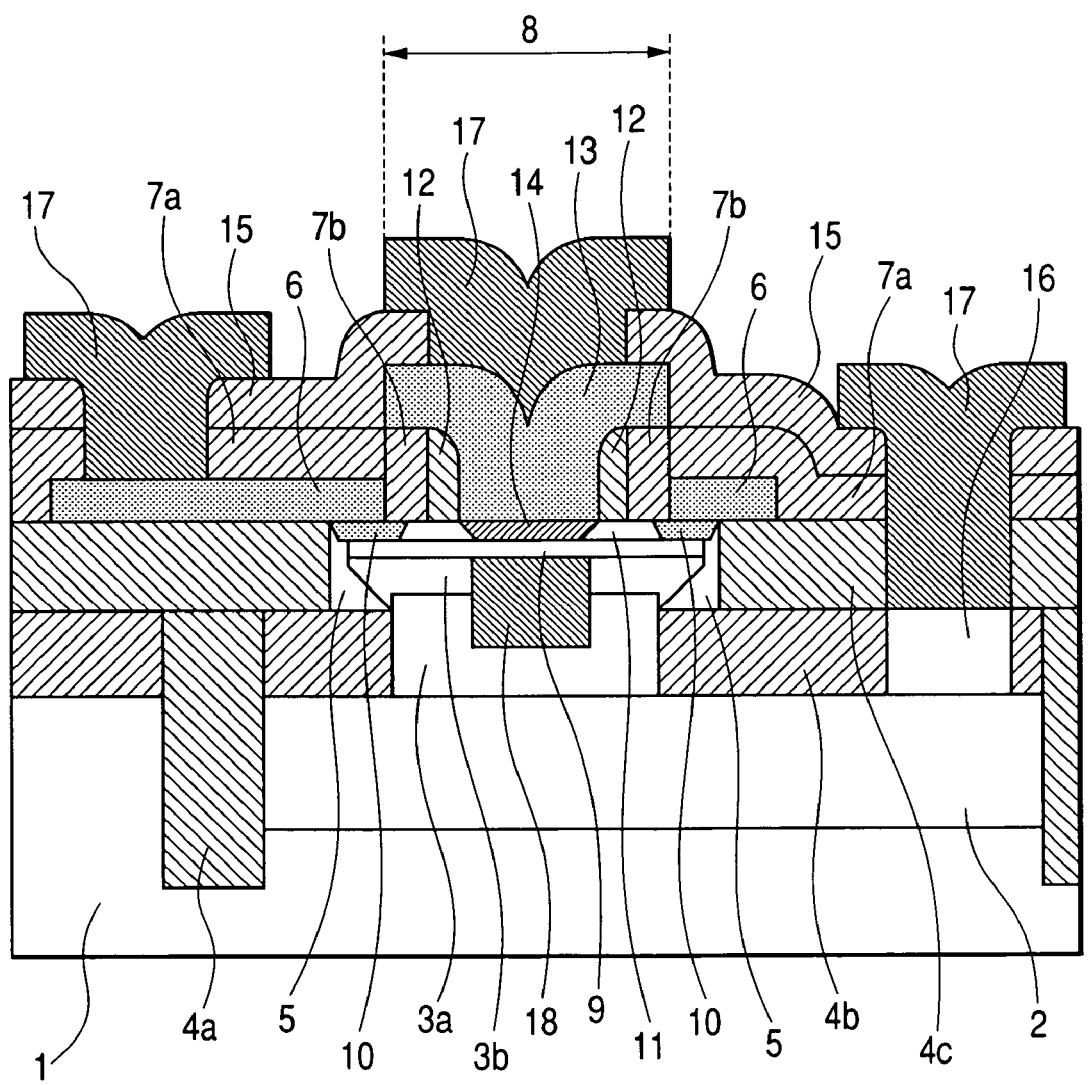
FIG. 9 is a cross sectional view showing an embodiment of a semiconductor device according to the invention.

FIG. 9 is a cross sectional view showing an embodiment of a semiconductor. The structure has an n-type region 18 in a second low concentration n-type collector layer 3b, and a first low concentration n-type collector layer 3a just below an emitter layer 14, wherein the n-type region may be formed by ion implantation.

Such a structure may allow for an increase in the low concentration n-type collector layer only in the transistor intrinsic portion, and carrier running time may be shortened by the reduction of the width for the collector depletion layer. Increase in the collector capacitance caused by the increase of the impurity concentration in the intrinsic portion of the low concentration n-type collector layer can be compensated for by decreasing the n-type impurity concentration in the external collector region. Accordingly, the high speed performance of the transistor may be enhanced and the collector capacitance decreased.

Figure 10:
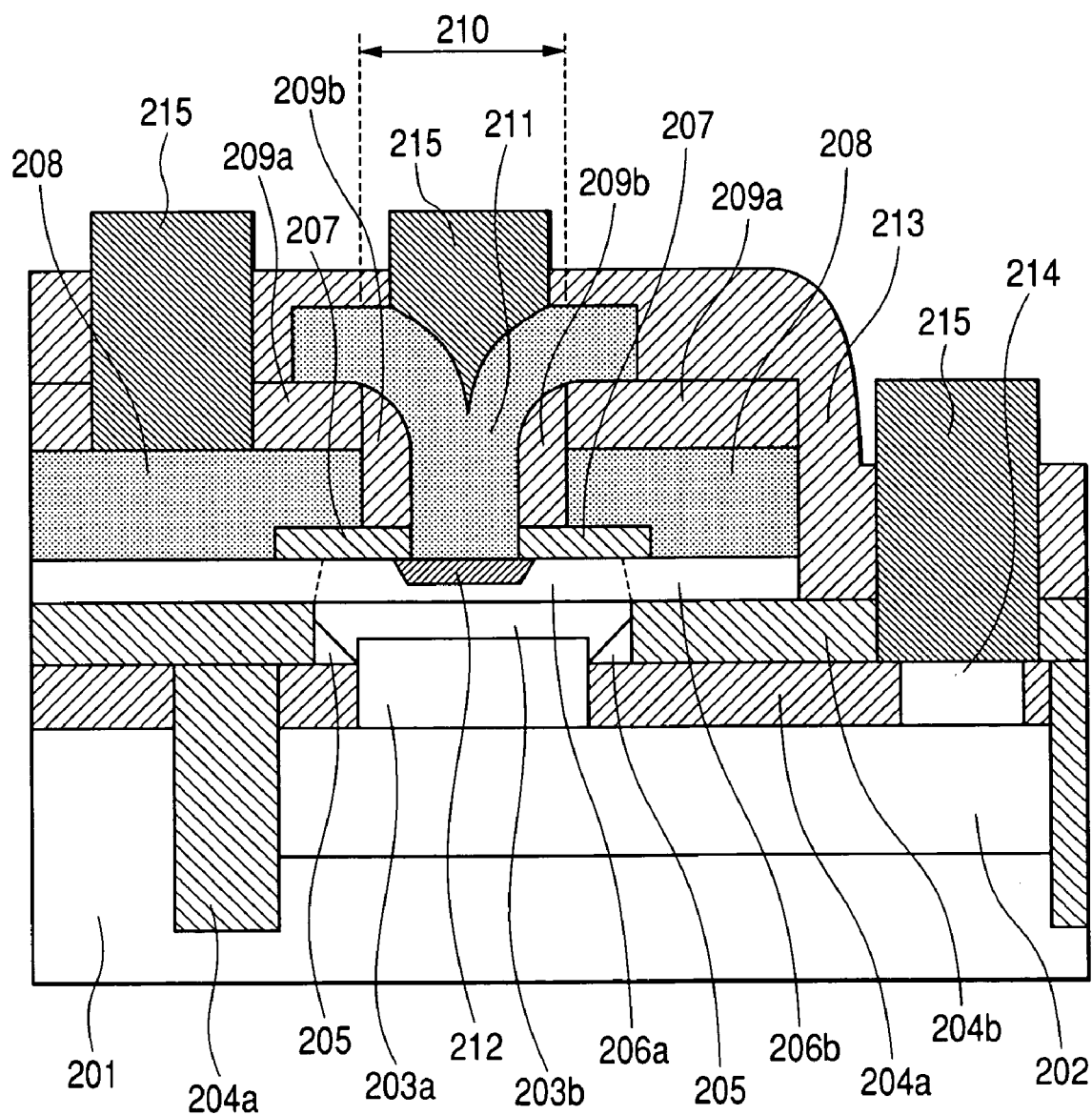
FIG. 10 is a cross sectional view showing an embodiment of a semiconductor device according to the invention.

FIG. 10 is a cross sectional view showing an embodiment of a semiconductor device. The semiconductor structure includes an insulating film 204c has a height equal with that of a second low concentration n-type collector layer 203a, wherein the sides of the two layers are in contact, or are closely proximate, and wherein a p-type base layer 206 is disposed over the surface of the two layers. The base layer 206 forms a base layer 206a of single crystals over the second collector layer 203b, and an external base layer 206b of polycrystals over the insulating film 204b. A patterned protection insulating film 207 may be disposed over the base layer 206, and a high concentration p-type base extension electrode 208 of polycrystalline silicon-germanium may be disposed thereover.

Further, a wide junction portion may be obtained between the external base layer 206a and the base extension electrode 208. Accordingly, the base resistance may be lowered, as may be the collector capacitance.

Figure 11A:
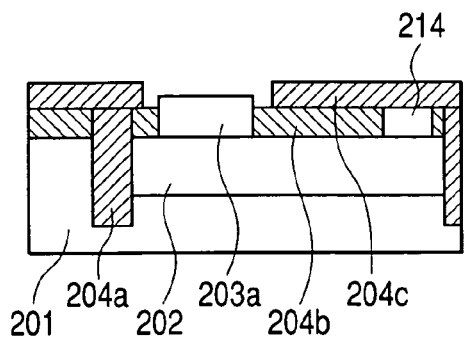
FIGS. 11A, 11B, 11C, 11D, 11E, and 11F are cross sectional views showing a method of manufacturing an embodiment of a semiconductor device according to the invention.

After forming a device having a first collector layer 203a, an n-type high concentration collector extension layer 214, and insulating films 204a and 204b, such as by a high concentration n-type buried layer 202 over a silicon substrate 201, an insulating film 204c may be deposited and an opening may be formed above the first collector layer, such as by lithography and dry etching, to obtain the structure of FIG. 11A. If the insulating film 204b and the insulating film 204c are made of different materials, the insulating film 204b may be etched before deposition of the insulating film 204c. If a silicon oxide film is used as the insulating film 204b, and a silicon nitride film for the insulating film 204c, for example, the insulating film 204b may be etched with an aqueous hydrofluoric acid solution, and the insulating film 204c may be selectively etched to the insulating film 20b by a phosphoric acid at 80° C.

If the insulating film 204b and the insulating film 204c are of the same material, a silicon oxide film may be used for the insulating film, and a patterned insulating film may be deposited and etched isotropically to obtain the structure shown in FIG. 11A. In this case, the surface of the first collector layer 203a may have a square, rectangular or octagonal surface shape in which the paired two sides are oriented in the <110> direction or <100> direction. The height for the insulating film 204b may be about 30 to 40 nm.

Figure 11D:
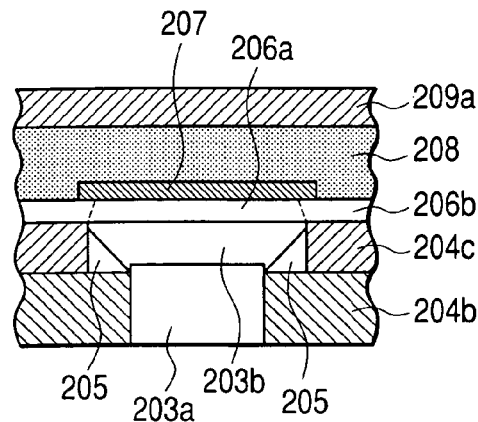
Figure 11B:
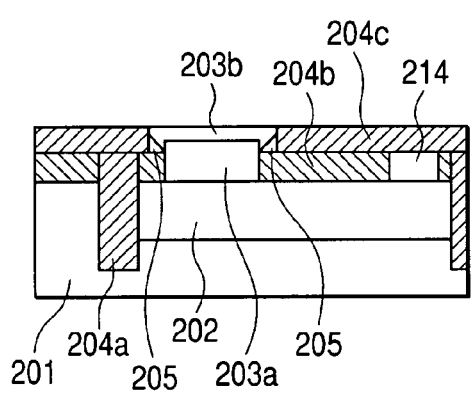

After forming the structure of FIG. 11A, a second low concentration n-type collector layer 203b of single crystal silicon-germanium may be formed selectively on the first collector layer 203a, such as by epitaxial growing. The second collector layer 203b may be grown to extend in the horizontal direction, such as to form an inverted "mesa" shape having a facet face a gap 205 relative to the insulating film 204b and the insulating film 204c (FIG. 11B). The second collector layer 203b and the insulating film 204c may be equal in the height and may be in contact or in close proximity on the sides thereof. A p-type base layer 206 of silicon-germanium may be deposited over the entire surface of the insulating film 204c, such as by epitaxial growing.

Figure 11E:
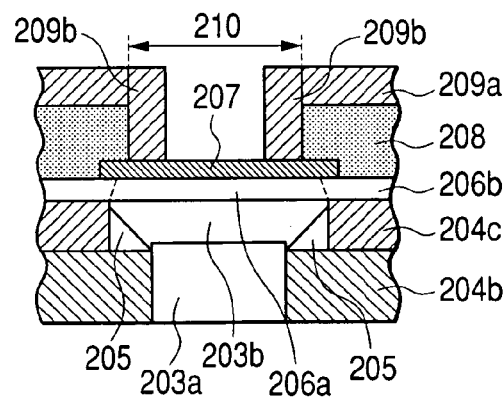
Figure 11C:
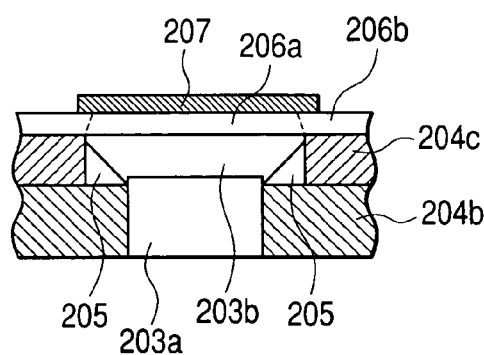

The base layer 206 may form a single crystal base layer 206a over the collector layer 204b, and a polycrystalline base layer 206b over the insulating film 204c. Further, an insulating film may be deposited and patterned by lithography and etching to form a protection insulating film 207, and to obtain a structure of FIG. 11C. A high concentration p-type base extension electrode 208 of polycrystalline silicone or polycrystalline silicon-germanium, and an insulating film 209a may be deposited (FIG. 11D), and an opening 210 may be formed in the base extension electrode 208 and the insulating film 209a by lithography and dry etching. The p-type impurities of the base extension electrode 208 may, for example, be injected by ion implantation or added by deposition.

Figure 11F:
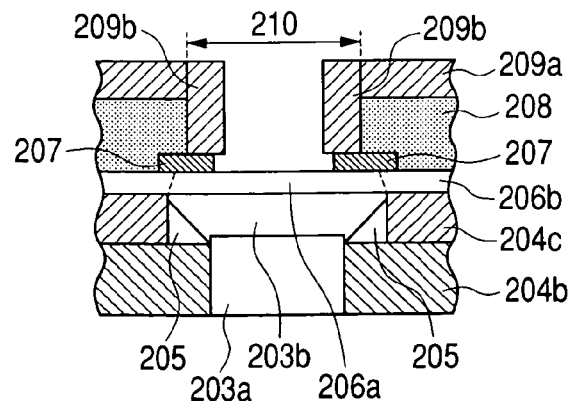

After depositing the insulating film, an emitter-base separation insulating film 209a may be formed in the opening 210 by dry etching (FIG. 11E), and the protective oxide film 207 in the opening may be selectively removed by etching to obtain a structure of (FIG. 11F). The protection insulating film 207 is of a material different from that of the insulating films 209a and 209b, and thus selective etching is provided for by silicon oxide for the insulating films 209a and 209b, silicon nitride for the protection insulating film 207, and phosphoric acid at 80° C. for etching.

A high concentration n-type emitter electrode 211 of high concentration p-type polycrystalline silicon may be formed in the opening, and n-type impurities may be diffused by applying a heat treatment to form an emitter region 212 in the single crystal p-type base 206a. When the base extension electrode 208 and the emitter electrode 211 are patterned, the structure is buried with an insulating film 213, and an opening is formed over each of the regions for the base extension electrode 208, the emitter electrode 211 and the collector extension layer 214, the electrodes 215 are formed, and the structure shown in FIG. 10 is obtained.

Figure 12:
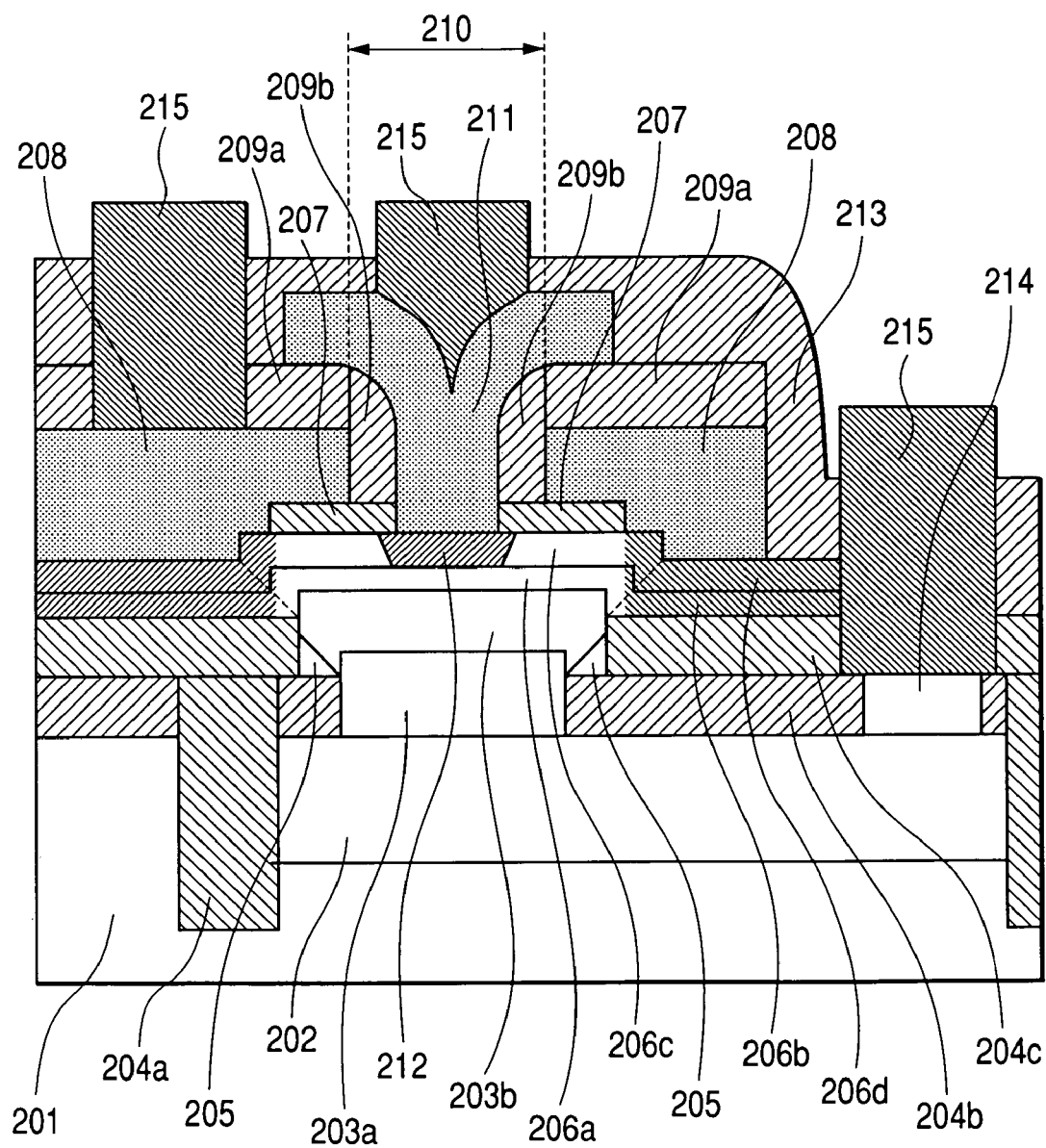
FIG. 12 is a cross sectional view showing an embodiment of a semiconductor device according to the invention.

FIG. 12 shows a cross sectional view of an embodiment of a semiconductor device. The surface of a second low concentration n-type collector layer 203b may protrude above an insulating film 204c, a p-type base layer 206a, a p-type external base 206, and a low concentration single crystal silicon layer (or low concentration single crystal silicon-germanium layer), 206c and a low concentration polycrystalline silicon layer, or low concentration polycrystalline silicon-germanium layer (206d), may be disposed over the entire surface. Low concentration silicon layers (or low concentration silicon-germanium layers) 206c and 206d, and base layers 206a and 206b not covered with a protection oxide film 207 may be doped to a high concentration p-type type by ion implantation.

Since the surface of the second collector layer 203b protrudes above the insulating film 204c, the single crystal regions 206a and 206c for the base layer disposed over the second collector layer and the low concentration silicone layer (or low concentration silicon-germanium layer), disposed on the base layer, respectively, extend in the horizontal direction, thereby increasing the alignment margin upon forming the opening 210. Thus, the transistor size can be reduced. Further, since the emitter is formed in the low concentration single crystal silicon layer 206c, the p-type and n-type impurity concentrations in the base and emitter regions, respectively, may be controlled at higher accuracy as compared to the diffusing of the n-type impurities into the p-type crystals. Further, since the p-type impurities are injected, by ion implantation, selectively to the base layers 206a and 206b and the low concentration layers 206c and 206d, the base resistance can also be decreased. Accordingly, the size of the device may be refined and the yield improved, and the base resistance and the collector capacitance of the bipolar transistor decreased.

Starting from the structure in FIG. 11A, a second low concentration n-type collector layer 203b of single crystal silicon-germanium is formed to protrude above the insulating film 204c, such as by epitaxial growth. A base layer of p-type silicon-germanium may be deposited over the entire surface to form a single crystal base layer 206a over the second collector layer, and a polycrystalline external base layer 206b over the insulating film 204c. Further, a low concentration silicon layer (or low concentration silicon-germanium layer) may be deposited to form a low concentration single crystal silicon layer (or low concentration silicon-germanium layer) 206c over the single crystal base layer 206a, and a low concentration polycrystalline silicon layer (or low concentration polycrystal-germanium layer) 206d over the polycrystalline external base layer 206b. Single crystal regions 206a and 206c of the base layer and the low concentration silicon layer (or low concentration silicon-germanium layer) may extend in the horizontal direction. An oxide film may be deposited, a protective oxide film 207 formed on the single crystal base layer 206a, such as by patterning using lithography and etching, and p-type impurities may be injected into the low concentration silicon layers (or low concentration silicon-germanium layers) 206c and 206d and the base layers 206a and 206b not covered with the protective oxide film, such as by ion implantation. The structure shown in FIG. 12 may be obtained by the steps discussed hereinabove with respect to FIG. 11.

Figure 13:
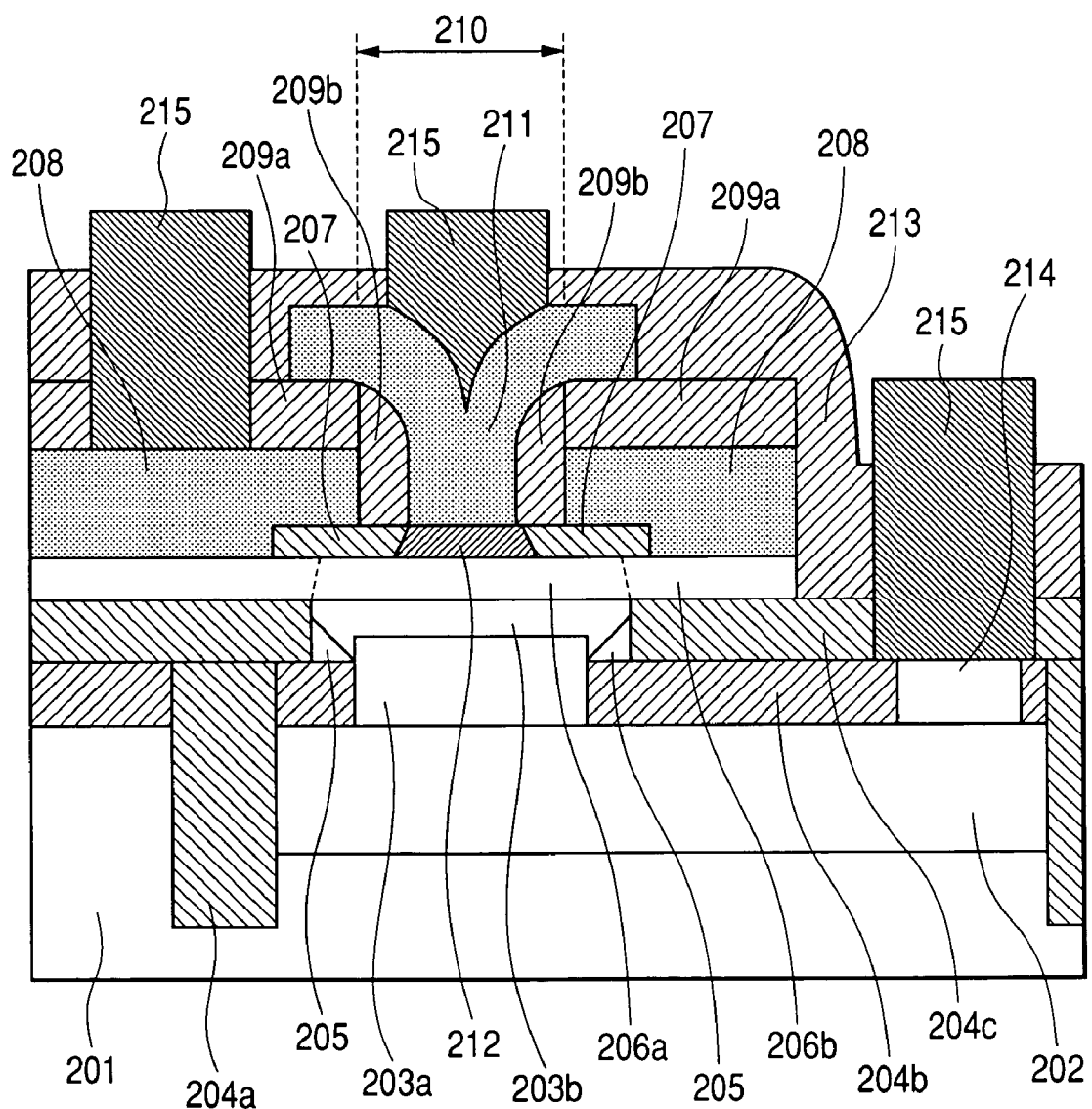
FIG. 13 is a cross sectional view showing an embodiment of a semiconductor device according to the invention.

FIG. 13 shows a cross section of an embodiment of a semiconductor device. The n-type emitter layer 212 of n-type single crystal silicon or single crystal silicon-germanium may be disposed in an opening surrounded with a protection insulating film 207, above a p-type base layer 206a of a single crystal-germanium, over which an emitter electrode 211 of a high concentration n-type polycrystalline silicon may be disposed.

The semiconductor device may be formed by formation of an emitter layer 212 of an n-type single crystal silicon or n-type single crystal silicon-germanium, such as by selective epitaxial growing starting from the structure shown in FIG. 11(f), followed by formation of an emitter electrode 211 of a high concentration n-type polycrystalline silicon layer.

Since the emitter layer 212 may be formed by epitaxial growing, heat treatment for the diffusion of n-type impurities is not necessary upon forming the emitter layer. Accordingly, re-distribution of the p-type impurities to extend the base width and can attain a reduced base width caused by the heat treatment is avoided. Thus, the carrier running time in the base may be shortened and an increase in the operation speed attained in a transistor having a low collector capacitance.

Figure 14:
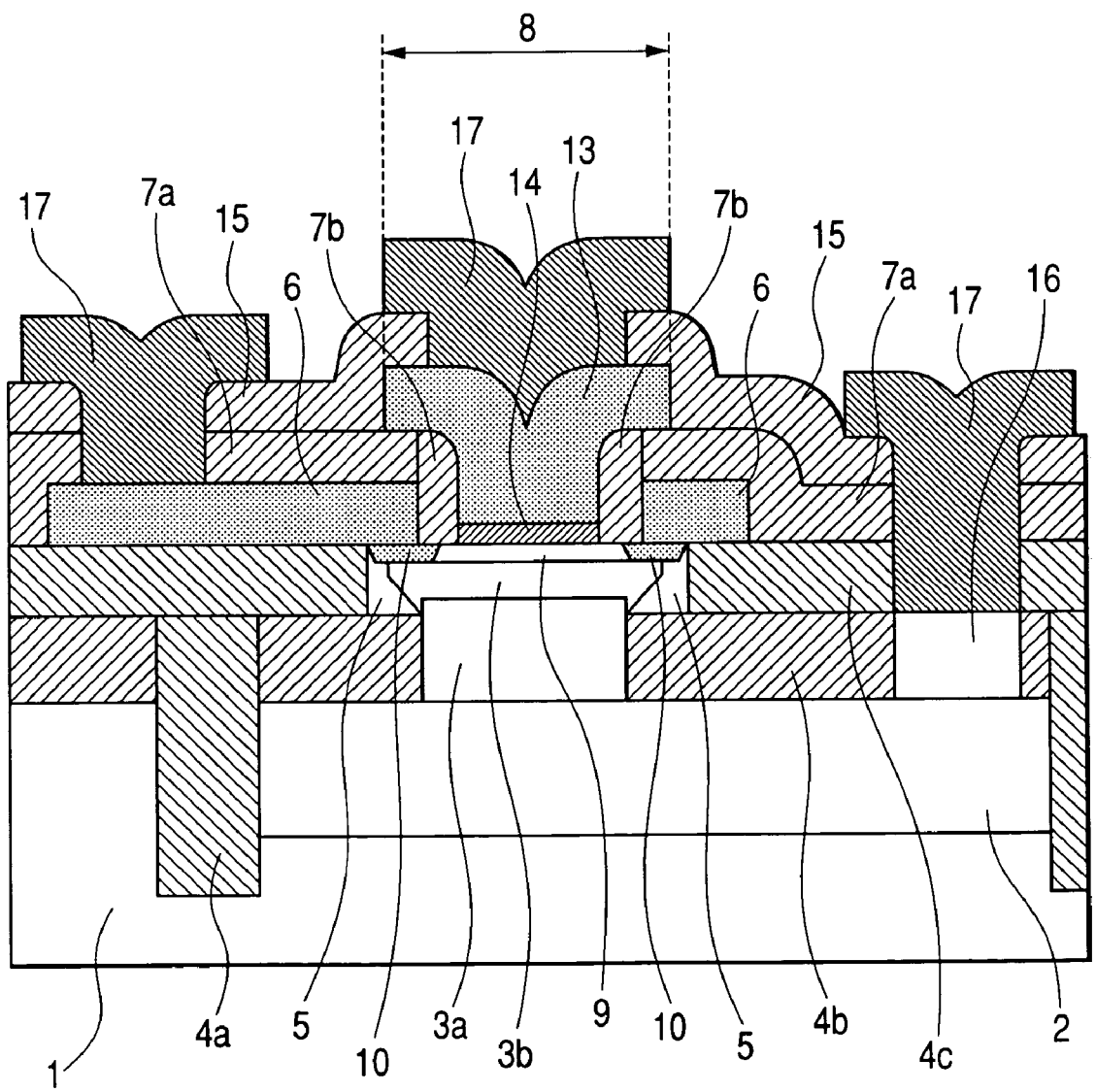
FIG. 14 is a cross sectional view showing an embodiment of a semiconductor device according to the invention.

FIG. 14 is a cross section showing an embodiment of a semiconductor device. A p-type base layer 9 of single crystal silicon-germanium may be disposed selectively over the second collector layer 3b of a single crystal silicon-germanium, and a single crystal n-type emitter layer 14 my be disposed in an opening surrounded with an emitter base separation insulating film 7b over the base layer 9.

With reference to FIG. 4E, a base layer 9 may be formed, such as by selective epitaxial growing, until the surface is in contact with the lower portion of the emitter-base separation insulating film 7b. Successively, an emitter layer 14 of n-type single crystal silicon or n-type single crystal silicon-germanium may be formed in the opening, such as by selective epitaxial growing. An emitter electrode 13 of a high concentration n-type polycrystalline silicon may be formed over the emitter layer 14, and subsequently the steps discussed hereinabove with respect to FIG. 4 may be performed to obtain a structure shown in FIG. 14.

Since the emitter layer 14 may be obtained by epitaxially growing the n-type single crystal silicon or n-type single crystal silicon-germanium, heat treatment for the diffusion of n-type impurities upon forming the emitter is unnecessary. Accordingly, extension of the width for the base layer 9 caused by re-distribution of impurities during heat treatment can be avoided, and higher operation speed can be attained. Furthermore, since the base layer 9 and the emitter layer 14 may be grown continuously, intrusion of oxide film or the like to the base-emitter junction can also be avoided.

Further, since there is no need to consider misalignment in the lithography of the emitter forming region and the base layer, and since the emitter layer 14 is isolated by the emitter base insulating film 7b from the eternal base layer 10, there is no need to form an insulative layer inside the insulating film 7b. This enables further decrease of the collector capacitance and further decrease of the base resistance. Accordingly, it is possible to decrease both the collector capacitance and the base resistance to attain a bipolar transistor with a high operation speed and decreased consumption power.

According to the embodiments described herein, the external collector region can be depleted by making a portion of the collector layer to extend in the upward direction and in the horizontal direction. Further, since the width for the depletion layer on the side of the collector is extended in the collector-base junction, the parasitic capacitance between the collector and the base can be decreased drastically. This enables high speed operation of the transistor and can decrease the consumption power of the transistor. In the case of a hetero bipolar transistor using silicon-germanium for the collector and the base, since the collector layer has an inverted mesa structure, internal strain is reduced, and a collector layer and a base layer having a high germanium composition can be formed. As a result, the electron band discontinuous quantity in the emitter-base junction can be made larger to attain a hetero bipolar transistor of higher operation speed and higher performance.

If not otherwise stated herein, it may be assumed that all components and/or processes described heretofore may, if appropriate, be considered to be interchangeable with similar components and/or processes disclosed elsewhere in the specification. It should be appreciated that the systems and methods of the present invention may be configured and conducted as appropriate for any context at hand. The embodiments described hereinabove are to be considered in all respects only as illustrative and not restrictive. As such, all modifications and variations of the present invention that come within the meaning, range, and equivalency of the claims hereinbelow are to be embraced within the scope thereof.

What is claimed is:

1. A semiconductor device, comprising:
   a first semiconductor layer of a first conduction type disposed over a semiconductor transistor region of a semiconductor substrate, wherein the semiconductor transistor region has an outer periphery substantially covered along the a vertical extension thereof with a first insulating film, wherein the first semiconductor layer has a shape extending in an upward direction and in a horizontal direction starting from a vertical intersect of the semiconductor transistor region and the first insulating film;
   a second semiconductor layer of a second conduction type disposed over the first semiconductor layer; and
   a third semiconductor layer of the first conduction type disposed over the second semiconductor layer;
   wherein a cavity is formed surrounding the first semiconductor layer, bounded at a lower portion thereof by the first insulating film.

2. A semiconductor device according to claim 1, wherein a first polycrystalline layer of the second conduction type is disposed over the first insulating film and is in connection with the second semiconductor layer; and wherein a second polycrystalline layer of the first conduction type is disposed over the third semiconductor layer; and wherein a second insulating film is disposed separating the first polycrystalline layer and the second polycrystalline layer.

3. A semiconductor device according to claim 1, wherein a cross section of a portion of the first semiconductor layer forms a polygonal shape in which paired sides are oriented in a <110> or <111> direction.

4. A semiconductor device according to claim 1, comprising a bipolar transistor having the first semiconductor layer as a collector, the second semiconductor layer as a base and the third semiconductor layer as an emitter.

5. A semiconductor device according to claim 4, wherein the collector and the base comprise one of single crystal silicon-germanium and single crystal silicon-germanium-carbon, and the emitter comprises one of single crystal silicon, single crystal silicon-germanium and single crystal silicon-germanium-carbon.

* * * * *